US011932181B2

(12) United States Patent
Bajfus et al.

(10) Patent No.: US 11,932,181 B2
(45) Date of Patent: Mar. 19, 2024

(54) ELECTRONIC COMPONENT WITH GROUND CODING FOR A MOTOR VEHICLE

(71) Applicant: Bayerische Motoren Werke Aktiengesellschaft, Munich (DE)

(72) Inventors: Fabian Bajfus, Freising (DE); Stephan Fahrnbauer, Munich (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 0 days.

(21) Appl. No.: 17/918,828

(22) PCT Filed: Mar. 30, 2021

(86) PCT No.: PCT/EP2021/058246
§ 371 (c)(1),
(2) Date: Oct. 13, 2022

(87) PCT Pub. No.: WO2021/244789
PCT Pub. Date: Dec. 9, 2021

(65) Prior Publication Data
US 2023/0150444 A1 May 18, 2023

(30) Foreign Application Priority Data

Jun. 4, 2020 (DE) ...................... 10 2020 114 889.5

(51) Int. Cl.
*B60R 16/023* (2006.01)
*H03K 19/21* (2006.01)

(52) U.S. Cl.
CPC ............ *B60R 16/023* (2013.01); *H03K 19/21* (2013.01)

(58) Field of Classification Search
None
See application file for complete search history.

(56) References Cited

U.S. PATENT DOCUMENTS 6,304,043 B1 * 10/2001 Klostermeier ....... H04B 5/0012
315/366
2006/0211307 A1 9/2006 Ueno et al.
(Continued)

FOREIGN PATENT DOCUMENTS

CN 204279227 U 4/2015
DE 10 2009 002 867 A1 11/2010
(Continued)

OTHER PUBLICATIONS

International Search Report (PCT/ISA/210) issued in PCT Application No. PCT/EP2021/058246 dated Jul. 2, 2021 with English translation (five (5) pages).
(Continued)

*Primary Examiner* — Jared Fureman
*Assistant Examiner* — Aqeel H Bukhari
(74) *Attorney, Agent, or Firm* — Crowell & Moring LLP

(57) ABSTRACT

An electronic component includes external ground connections for connecting to a cable harness and internal ground connections electrically coupled to paired external ground connections so that the potential at each internal ground connection corresponds to the potential at the paired external ground connection. An analysis circuit determines on which internal ground connections first and second signal information is applied to infer a coding of the component from the pattern of the internal ground connections being supplied with the first and second potential. A combination circuit connects the internal ground connections to the external ground connections such that when a ground line of a cable harness is connected to precisely one of the external ground connections, the first signal information is applied to a respective different sub-quantity of internal ground connections depending on which of the external ground connections the ground line is connected to.

12 Claims, 6 Drawing Sheets

(56) References Cited

U.S. PATENT DOCUMENTS

2019/0128945 A1* 5/2019 Cho .................... B60R 21/0173
2020/0249312 A1* 8/2020 Lewandowski .......... H04Q 9/04

FOREIGN PATENT DOCUMENTS

| DE | 10 2010 033 545 A1 | 2/2012 |
| EP | 1 065 105 A1 | 1/2001 |
| EP | 3 425 425 A1 | 1/2019 |
| WO | WO 2019/034520 A1 | 2/2019 |

OTHER PUBLICATIONS

German-language Written Opinion (PCT/ISA/237) issued in PCT Application No. PCT/EP2021/058246 dated Jul. 2, 2021 (six (6) pages).
German-language Search Report issued in German Application No. 10 2020 114 889.5 dated Mar. 4, 2021 with partial English translation (10 pages).

* cited by examiner c)

d)

ELECTRONIC COMPONENT WITH GROUND CODING FOR A MOTOR VEHICLE

BACKGROUND AND SUMMARY

The present invention relates to an electronic component with ground coding for a motor vehicle.

In many cases, several identically constructed electrical or electronic components are installed in a motor vehicle. Examples of such electronic components are radar sensors which are fitted at several positions on or in the vicinity of a front bumper and/or on or in the vicinity of a rear bumper, seat modules for electrically adjusting the seats of the motor vehicle, seat heating control devices, seat pneumatic modules, back seat monitors, wireless charging trays, etc. In order to be able to determine the position of respective identically constructed electrical or electronic components in the motor vehicle so as to actuate them by way of a central control device, the principle of so-called ground coding is used.

In ground coding, in addition to a primary ground of the electrical or electronic component, further ground connections are connected to one another via a cable harness. For this purpose, a cable harness which makes electrical contact with the components has a so-called welded connector which electrically connects various ground lines to one another, e.g. by way of an ultrasonic welded connection. A respectively new position of the electrical or electronic component in the motor vehicle can occur by selectively making contact with different ground connections of the component, whereby an evaluation circuit is used to determine to which of the ground connections a ground line of the cable harness is connected. For this purpose, the evaluation circuit generally has an analog-to-digital converter which, for the ground coding, samples a reference voltage produced within the component. On the basis of the values measured for each ground connection, the variant and thus the position of the electrical or electronic component in the motor vehicle can then be determined.

The principle of the position detection via ground coding is explained with the aid of FIG. 1 in which FIGS. 1a to 1d each illustrate an identically constructed electronic component 10 which by way of example has three ground connections 11-13 with which contact is made in different ways via a differently designed cable harness 50. The electronic component 10 comprises, in addition to the ground connections referred to as external ground connections 11-13, respectively assigned internal ground connections 21-23. To simplify the illustration, an evaluation circuit required for evaluating the ground coding and further functional components of the electronic component 10 are not illustrated. As can be easily seen from FIG. 1, a respective external ground connection 11-13 is directly connected to an assigned internal ground connection 21-23. The internal ground connection 21 constitutes a so-called primary ground or vehicle ground here. The other ground connections 22, 23 constitute a ground connected to the primary ground 21 and are referred to as coding ground, the ground connection not being explicitly illustrated in the figure.

The cable harness 50 is designed individually for each coding of the electronic component 10. In the variant illustrated in FIG. 1a, the cable harness 50 comprises a ground line 51, in the variant illustrated in FIGS. 1b and 1d, the cable harness 50 comprises, in addition to a collector line 55, two ground lines 51 and 52 or 51 and 53, respectively. In the variant illustrated in FIG. 1c, the cable harness 50 comprises, in addition to the collector line 55, three ground lines 51, 52 and 53. The respective ground lines 51 and 52 (FIG. 1b), 51-53 (FIG. 1c) and 51 and 53 (FIG. 1d) for the four identically constructed components 10 are each electrically connected to the collector line 55 via a welded connector 54. The welded connector 54 can, for example, be produced by ultrasonic welding and is then referred to as an ultrasonic welded connector. The welded connector 54 here is generally designed as a so-called end connector over which a heat-shrink cap or heat-shrink tubing, in each case with an inner adhesive, is heat shrunk. A cover and back-connection for the strain relief of the welded connection are not illustrated in the schematic illustration.

As can be easily seen from the various variants in FIGS. 1a to 1d, contact is made with the external ground connections 11-13 in different ways by the cable harness 50. In all four variants, the ground line 51 is coupled to the external ground connection 11 of the primary ground. By way of the additional two coding grounds, four different coding variants are produced in total, wherein in the variant according to FIG. 1b the external ground connection 12 is connected to the ground line 52, in the variant according to FIG. 1c the external connections 12, 13 are connected to the ground lines 52, 53 and in the variant according to FIG. 1d the external ground connection 13 is connected to the ground line 53. The variant according to FIG. 1a does without any explicit coding here.

By way of these variants in making contact, a component position can be defined in each case. The respective variant is determined in that, in the electronic component 10, a reference voltage is applied to the internal ground connections 21-23 and is sampled via an A/D converter of the evaluation circuit which is not illustrated. If the external ground connection that is to be read is connected to reference potential via a ground line of the cable harness, the reference voltage breaks down and a very small value is measured at the output of the A/D converter. If the external ground connection that is to be read is not connected to a ground line of the cable harness, the reference voltage remains unchanged and a large value corresponding to the reference voltage is measured at the output of the A/D converter. On the basis of the values measured for the respective external and thus internal ground connections, the variant and thus the position can then be determined.

For the position detection, ground lines of the cable harness must therefore be connected to the welded connector already mentioned (sometimes also referred to as welded node) individually for each of the identically constructed components for each ground connection, with which contact is to be made, of the component. In order to seal the welded connector against moisture and longitudinal water, it is necessary to provide the welded connector with a heat-shrink cap or heat-shrink tubing, in each case with an inner adhesive. In order to realize strain relief for the welded line strand of the cable harness, back-connection and covering are required.

Depending on how many different positions have to be coded by means of the ground coding, the number of additional lines can be substantial. The additional ground lines to the welded connector, the welded connector itself including its heat-shrink cap provided for sealing and the strain relief add bulk over the entire length in the cable harness diameter which can lead to problems with space. The material for the ground lines and for the longitudinal water sealing cause weight and cost in the cable harness for each electrical or electronic component that is to be installed with position detection via ground coding.

These problems are aggravated in particular in that fully automated cable harness manufacturing, which comprises welded connectors, is not yet possible. For a solution that is suitable for automation, either expensive connector plugs must thus be used instead of the welded connector, or alternatively, direct wiring between the electrical or electronic component and a ground node, e.g. a joint connector, can be performed. This also requires additional modifications and in particular the provision of relatively large ground joint connectors.

The object of the invention is to specify an electronic component with which the ground coding for a motor vehicle can be structurally and/or functionally improved.

This object is achieved by an electronic component according to the features of claim 1 and a motor vehicle according to the features of claim 12 having an electronic component according to the invention. Advantageous configurations are specified in the dependent claims.

An electronic component with ground coding for a motor vehicle is proposed. Hereinbelow, an electronic component with ground coding is understood to mean an electrical or electronic component of the kind of which several of identical construction are intended to be installed in a motor vehicle. Such a component can, for example, be a radar sensor, a seating module for electrically adjusting a motor vehicle seat, a seat heating control device, a seat pneumatic module, a back seat monitor or a tray for wirelessly charging a user device. The list is to be considered as exemplary but not exhaustive. A plurality of the electronic components with ground coding are installed at different positions in the vehicle in each case.

In order to enable actuation of the electronic component in the correct position or processing of the signals delivered from the electronic component in the correct position, a respective electronic component, when it is installed in the motor vehicle, is identified via the ground coding. For this purpose, the electronic component comprises a plurality of external ground connections for selectively connecting to a cable harness of the motor vehicle and a plurality of internal ground connections. Each internal ground connection is electrically coupled to an assigned external ground connection so that the potential present at a respective internal ground connection corresponds to the potential present at the assigned external ground connection. The external ground connections can, for example, be designed as pins for producing a plug connection.

An evaluation circuit of the electronic component, which circuit is coupled to the internal ground connections, is designed to determine at which first subset of the internal ground connections first signal information representing a reference potential as a first potential is present and at which second subset of the internal ground connections second signal information representing a supply voltage potential as a second potential is present in order to infer a coding of the component from the pattern of the internal ground connections supplied with the first and the second potential. This coding can be transmitted, e.g., to a central control device.

The way in which the evaluation circuit is designed is irrelevant for the principle of the present invention. For example, the evaluation circuit can comprise an analog-to-digital converter (A/D converter) which applies a reference voltage produced or present in the electronic component to the internal ground connections and samples the potential present at the internal ground connections. The evaluation and determination of the pattern of the internal ground connections supplied with the first and second potential, in order to infer the coding of the component, can be carried out once during the production of the vehicle or during each restart of the vehicle or at regular intervals.

The electronic component further comprises a combination circuit which connects the plurality of internal ground connections to the plurality of external ground connections in such a way that, when a (precisely one) ground line of a cable harness is connected to precisely one of the external ground connections, the first signal information is present at a respectively different first subset of the internal ground connections in a predetermined manner depending on which of the external ground connections the ground line is connected to.

With the electronic component according to the invention, the position of identically constructed electronic components in a motor vehicle can be reliably determined using only a single connected ground line. As a result, welded connectors including longitudinal water sealing can be eliminated for the position detection. This allows the cable harness to be provided significantly more easily, with less weight and at lower cost.

An expedient configuration provides that the plurality of external ground connections and the plurality of internal ground connections each comprise at least two ground connections. In particular, a first ground connection of the internal ground connections is connected to a primary ground, in particular to a terminal, of the motor vehicle, while all the other ground connections of the internal ground connections are connected to a respective coding ground. A respective coding ground is a ground connected to the primary ground. The invention makes it possible to arrange the first ground connection of the internal ground connections and thus the assigned external ground connection in the main current path of the motor vehicle, as a result of which the described solution can also be used for high-current applications, such as those provided in electrified motor vehicles.

According to a further expedient configuration, the number of external ground connections is defined by the required number of codings. The number n of the codings is determined from the number CM of the coding grounds according to the formula: $n=2^{CM}$. This means that, in the case of three external ground connections (i.e. a primary ground and two coding grounds (CM=2)), four different positions of the electronic component can be coded. In the case of eight external ground connections, for example, eight different positions can be coded in total.

A further expedient configuration provides that the combination circuit comprises a number of logic chips which connect the plurality of internal ground connections to the plurality of external ground connections. The logic chips can be interconnected in one or at least two cascade stages here.

A further expedient configuration provides that the logic chips of that cascade stage which are respectively connected to an external ground connection on the output side are respectively connected directly to the first ground connection of the internal ground connections on the input side. As a result, it is ensured that the primary ground is connected to the ground line of the cable harness in every case irrespective of which of the external ground connections the ground line of the cable harness is connected to.

In principle, any logic chip or semiconductor component which permits only a unidirectional current flow can be used as logic chips. Different types of logic chips or semiconductor components can be combined with each other in any desired way here. In particular, the logic chips of the combination circuit are of one or more of the following types: AND gates, NOT gates, NAND gates, NOR gates, XOR gates or XNOR gates. As unidirectional semiconductor components, use can be made of transistors and/or diodes, which then also constitute logic chips in the sense of the invention.

The electronic component or the combination of internal ground connections, evaluation circuit and combination circuit can optionally be designed as an IC chip or as a discrete circuit on a carrier. In both variants, mass production at low cost is possible.

According to a further aspect of the present invention, a motor vehicle having a plurality of electronic components as described above is described, which components are each designed according to one or more embodiments. The plurality of electronic components are then, as described, arranged at different positions in the motor vehicle.

A motor vehicle of this kind has the advantage of a simplified cable harness which in particular no longer requires welded connectors for the components according to the invention. As a result, the cable harness can be provided with less weight and at lower cost.

The invention is described in more detail below on the basis of exemplary embodiments in the drawings.

DETAILED DESCRIPTION

Figure 1:
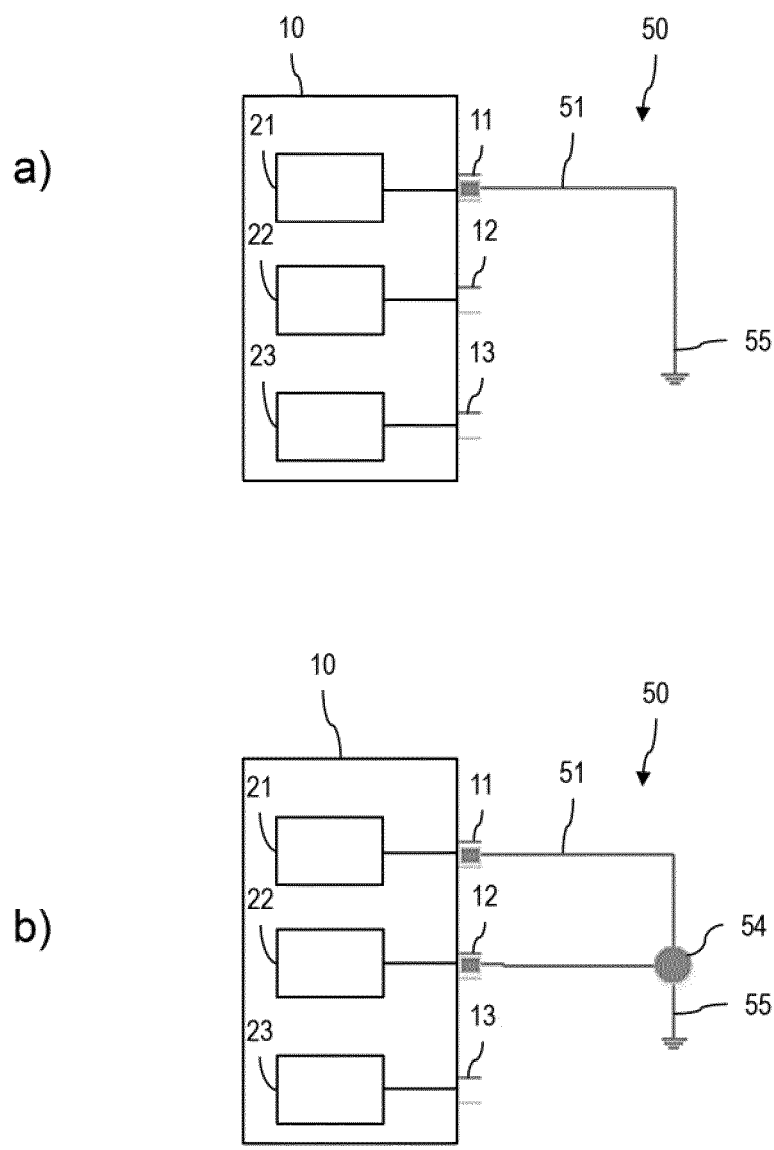
FIGS. 1a, 1b, 1c, and 1d each show a conventional electronic component which is designed for position detection via ground coding.
Figure 1:
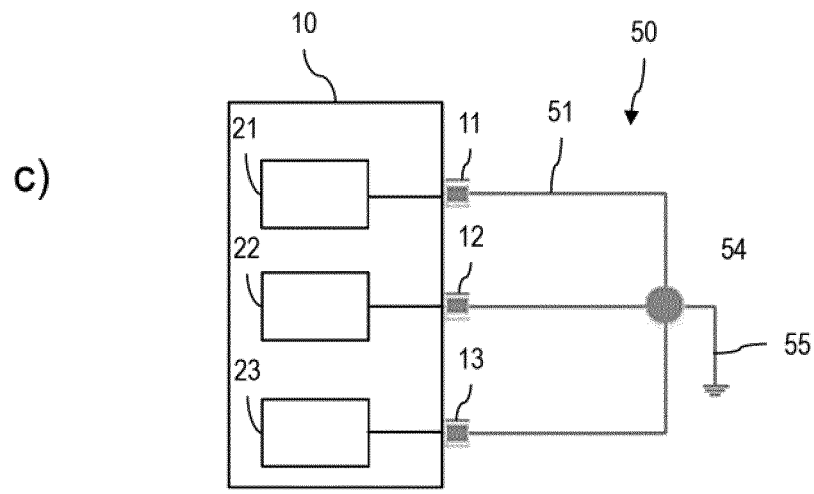
Figure 1:
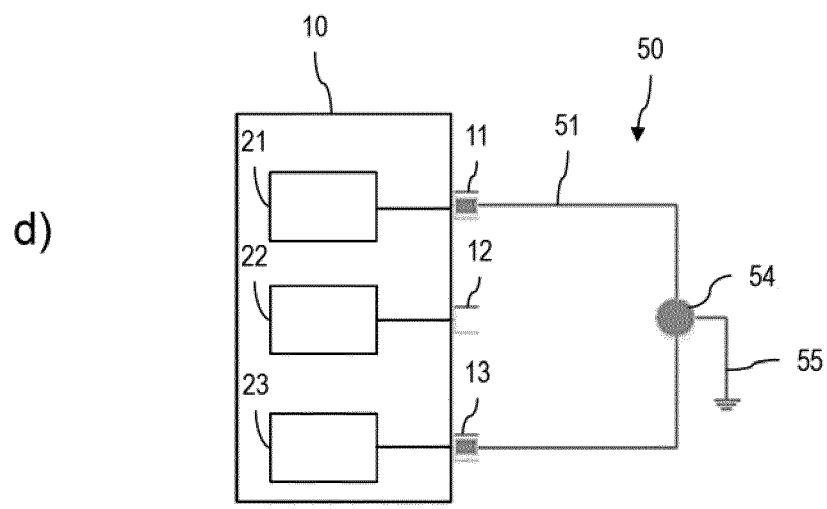

In all of the figures, identical elements are provided with identical reference signs. For reasons of simplification and improved illustration, only the components which are essential for understanding the invention are illustrated.

FIGS. 2a to 2d each show an identically constructed electronic component 10 according to the invention with which position detection via ground coding is realized by means of a combination circuit 30. The electronic component 10 shown in FIGS. 2a to 2d has by way of example, as in the already described example in FIGS. 1a to 1d, four external ground connections 11-14. A number of three internal ground connections 21-23 are assigned to the four external ground connections 11-14. The (first) ground connection 21, provided with the reference sign 21, of the internal ground connections 21-23 forms a primary ground which is connected to a terminal (not shown) of the motor vehicle. In a known way, the terminal constitutes the negative line directly from the battery or vehicle ground of the motor vehicle. The other ground connections 22, 23 of the internal ground connections 21-23 are connected to a respective coding ground, which is not explicitly illustrated. A respective coding ground is a ground connected to the primary ground.

The evaluation circuit described at the outset for determining at which first subset of the internal ground connections 21-23 a reference potential as a first potential is present and at which second subset of the internal ground connections 21-23 second information representing a supply voltage potential as a second potential is present is not illustrated for the sake of simplicity. As described at the outset, a coding of the respective electronic component 10 and thus its positioning in the motor vehicle is inferred from the pattern of the internal ground connections 21-23 supplied with the first and the second potential. The sum of the first and second subset of the internal ground connections 21-23 corresponds to the total number of the internal ground connections 21-23.

The identically constructed electronic components 10 according to the invention according to FIGS. 2a to 2d comprise a combination circuit 30. The combination circuit 30 is designed to connect the plurality of internal ground connections 21-23 to the plurality of external ground connections 11-14 in such a way that, when a ground line 51 of the cable harness is connected to precisely one of the external ground connections (11 in FIG. 2a, 12 in FIG. 2b, 13 in FIG. 2c or 14 in FIG. 2d), the first signal information, e.g. reference potential, is present at a respective different first subset of the internal ground connections 21-23 in a predetermined manner depending on which of the external ground connections 11-14 the ground line 51 of the cable harness is connected to.

For this purpose, the combination circuit 30 has a number of logic chips 31, 41-43 which are interconnected in cascading fashion. In the exemplary embodiment illustrated here, the logic chips 31, 41-43 are designed as AND gates. The logic chips 31, 41-43 could alternatively also be designed as NOT, NAND, NOR, XOR or XNOR gates. The logic chips could likewise be formed by semiconductor switching elements, in particular transistors or diodes. It is clear to a person skilled in the art that the combination circuit 30 can comprise any desired combination of different logic chips here. The exemplary embodiment according to FIGS. 2a to 2d must then be correspondingly adapted.

In the case of the electronic component 10 shown in FIGS. 2a to 2d, four different codings are possible in total. The number of the different codings results from the number of the external ground connections 11-14 and of the internal ground connections 21-23. The number n of the codings is determined from the number CM of the coding grounds (in the exemplary embodiment according to FIGS. 2a to 2d: 2) as: $n=2^{CM}=4$. This results from the circumstance that the primary ground (which is connected to the ground connections 11 and 21, respectively) is routed to each of the external ground connections 11-14. The logic chips 41 to 43 are thus those logic chips which are connected to the external ground connections 12-13 on the output side. On the input side, the logic chips 41-43 are each connected directly to the first ground connection 21 of the internal ground connections 21-23. The second input connection of the logic chip 41 is connected to the coding ground 22 (i.e. to the internal ground connection 22). The second input connection of the logic chip 43 is connected to the coding ground 23 (i.e. to the internal ground connection 23). The logic chip 31 is connected to the second input connection of the logic chip 42 on the output side. The two inputs of the logic chip 31 are connected to the coding ground 22 (i.e. to the internal ground connection 22) and to the coding ground 23 (i.e. to the internal connection 23), respectively.

These configurations result in four different coding variants in total.

If the ground line 51 of the cable harness 50 is connected to the external ground connection 11, as illustrated in FIG. 2a, a current from a current or voltage source (not illustrated) of the electronic component 10 can flow from the primary ground 21 into the ground line 51 via the external ground connection 11. In contrast, a current flow via the coding grounds 22, 23 is not possible since the combination circuit 30 allows no coupling between the coding grounds 22, 23 and the external ground connection 11. The evaluating A/D converter of the evaluation circuit then detects a small value at the internal ground connection 21, while a high value is present at the internal ground connection 22, 23, caused by the supply voltage.

If the ground line 51 of the cable harness 50 is connected to the external ground connection 12, as illustrated in FIG. 2b, a current from a current or voltage source (not illustrated) of the electronic component 10 can flow both from the primary ground 21 and from the coding ground 22 into the ground line 51 via the external ground connection 12. In contrast, a current flow via the coding ground 23 is not possible since the combination circuit 30 allows no coupling between the coding ground 23 and the external ground connection 12. The evaluating A/D converter of the evaluation circuit then detects a small value at the internal ground connections 21, 22, while a high value is present at the internal ground connection 23, caused by the supply voltage.

The electronic component 10 according to FIG. 2c is connected to the ground line 51 of the cable harness 50 via its external ground connection 13. Due to the interconnection in the combination circuit 30, a current flow via the primary ground 21 and the two coding grounds 22, 23 is made possible when a supply voltage is set at the internal ground connections 21-23 via the evaluation circuit which is not illustrated. At all three internal ground connections 21-23, a very small value is thus measured at the evaluating A/D converter of the evaluation circuit since a connection to the reference potential of the cable harness 50 is present.

In the case of the electronic component 10 shown in FIG. 2d, which is connected to the ground line 51 of the cable harness 50 at the external ground connection 14, a current flows via the primary ground 21 and the coding ground 23 when a supply voltage is set at all three internal ground connections 21-23 via the evaluation circuit which is not illustrated. At the internal ground connections 21, 23, the evaluating A/D converter of the evaluation circuit then detects a small value while a high value is present at the internal ground connection 22, caused by the supply voltage.

Figure 3:
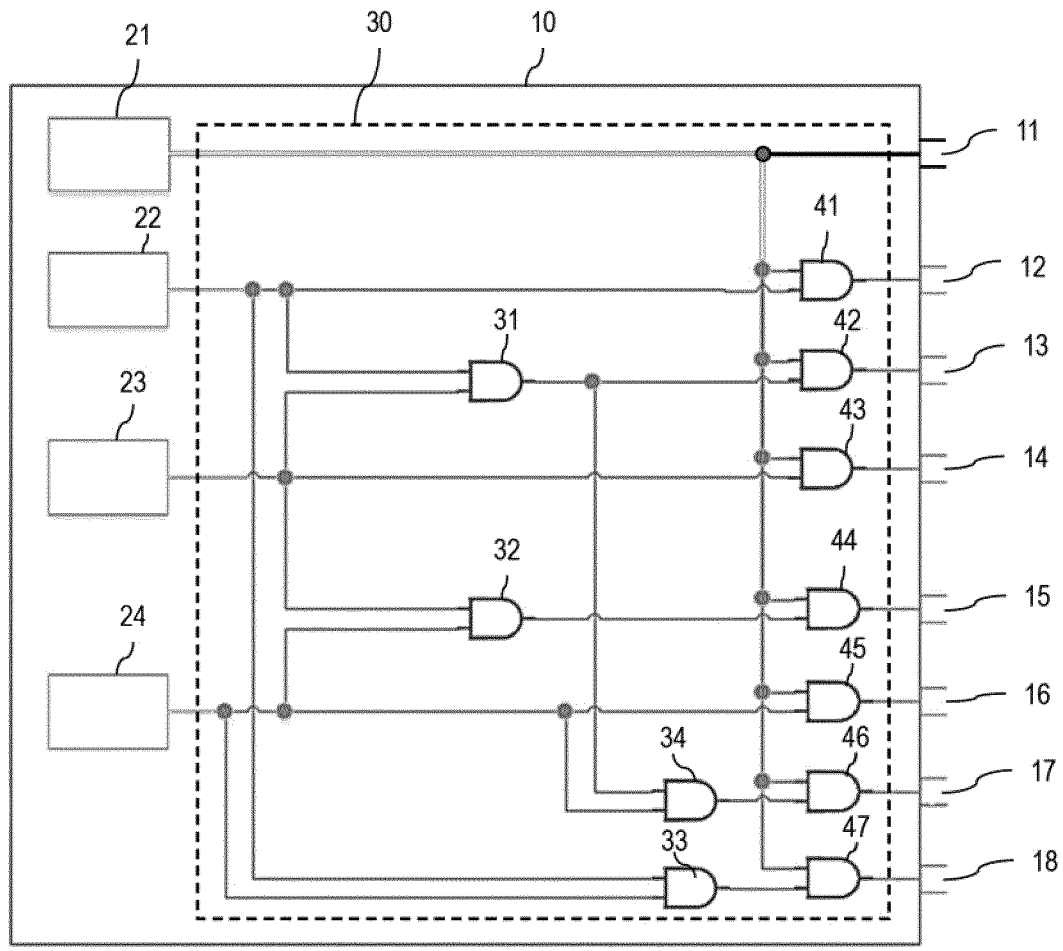
FIG. 3 shows an electronic component according to the invention with a combination circuit according to a first design variant for eight different codings in total.

FIG. 3 shows a further exemplary embodiment of an electronic component 10 according to the invention. In this exemplary embodiment, the electronic component 10 comprises a combination circuit 30 which connects four internal ground connections 21-24 to eight external ground connections 11-18. For this purpose, the combination circuit 30 comprises, arranged in cascaded fashion, logic chips 31-33 in a first cascade stage, a logic chip 34 in a second cascade stage and logic chips 41-47 in a final cascade stage connected to the external ground connections 11-18. As in the preceding exemplary embodiment, the first input connection of each of the logic chips 41-47 is connected, on the input side, directly to the first ground connection 21 of the internal ground connections 21-24, which constitutes the primary ground. In this example, the electronic component 10 thus has three (3) coding grounds CM, as a result of which $n=2^3=8$ different codings are produced, which corresponds to the number of the external ground connections 11-18.

The logic chip 31 is connected, on the input side, to the coding grounds 22, 23 and, on the output side, to the second input connection of the logic chip 42, which in turn is connected to the external ground connection 13. The logic chip 32 is connected, on the input side, to the coding grounds 23 and 24 and, on the output side, to the second input connection of the logic chip 44, which is connected to the external ground connection 15 on the output side. The logic chip 33 is connected, on the input side, to the two coding grounds 22, 24 and, on the output side, to the logic chip 47, which is connected to the external ground connection 18 on the output side. The second input connections of the logic chips 41, 43 and 45 are connected directly to the coding grounds 22, 23, 24, respectively. On the output side, the logic chips 41, 43, 45 are connected to the external ground connections 12, 14, 16. The logic chip 34 of the second cascade stage is connected, on the input side, to the output of the logic chip 31 and to the coding ground 24 and, on the output side, to the second input connection of the logic chip 46, which is connected to the external ground connection 17 on the output side.

In this exemplary embodiment, too, the logic chips 31-33, 34, 41-47 are designed as AND gates. As explained above, other logic chips could also be used in the combination circuit 30. Gates of different types could also be connected to one another in the combination circuit 30 here.

Figure 4:
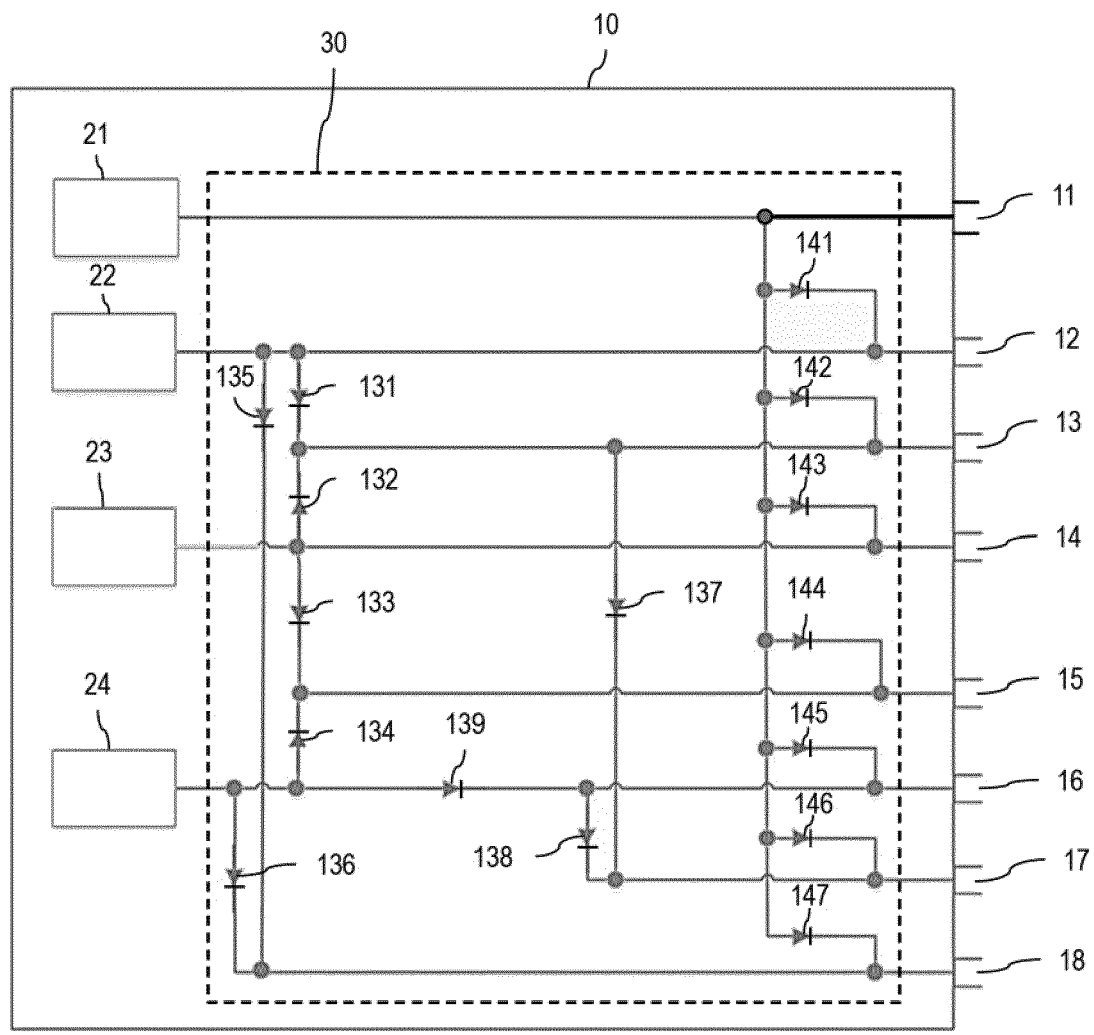
FIG. 4 shows an electronic component according to the invention with a combination circuit according to a second design variant for eight different codings in total.

FIG. 4 shows a further exemplary embodiment, in which the logic gates described in FIG. 3 are replaced with diodes 131-139, 141-147. The manner of operation of the combination circuit shown in FIG. 4 corresponds to that of the combination circuit 30 shown in FIG. 3. The exemplary embodiment shown in FIG. 4 has, in turn, four internal ground connections 21-24, the internal ground connection 21 constituting the primary ground and the three internal ground connections 22-24 constituting the coding grounds, and eight external ground connections 11-18. In this example, the electronic component 10 likewise has $n=2^3=8$ different codings, which corresponds to the number of the external ground connections 11-18.

The operation of the electronic components 10 illustrated in FIGS. 3 and 4 is identical and as follows:

If the ground line 51 of the cable harness 50 (see FIGS. 2a to 2d) is applied to the external ground connection 11, a current can flow into the external ground connection 11 via the primary ground 21, while no current flows via the coding grounds 22-24 due to the logic circuit 30. Consequently, the evaluation circuit (not shown) sets the following signal pattern which is specified in the sequence of the reference signs of the internal ground connections 21-24: L-H-H-H, wherein L constitutes the first signal information (low signal level) and H constitutes the second signal information (high signal level).

If the ground line 51 of the cable harness 50 is applied to the external ground connection 12, a current can flow into the external ground connection 12 via the primary ground 21 and the coding ground 22. Consequently, the evaluation circuit sets the following signal pattern at the internal ground connections 21-24: L-L-H-H.

If a ground line of the cable harness is connected to the external ground connection 13, a current can flow via the coding grounds 22, 23 when a reference voltage is applied to the internal ground connections 21-24. As a result, the following signal pattern is produced at the internal ground connections 21-24: L-L-L-H.

If a ground line of the cable harness is connected to the external ground connection 14, a current can flow via the primary ground 21 and the coding ground 23 when a supply voltage is applied to the internal ground connections 21-24. This produces, at the internal ground connections 21-24, a signal pattern: L-H-L-H.

If a ground line of the cable harness is connected to the external ground connection 15, a current can flow via the primary ground 21 and the coding grounds 23, 24 when a supply voltage is applied to the internal ground connections 21-24. This produces, at the internal ground connections 21-24, the signal pattern: L-H-L-L.

If a ground line of the cable harness is connected to the external ground connection 16, a current can flow via the primary ground 21 and the coding ground 24 when a supply voltage is applied to the internal ground connections 21-24. This produces, at the internal ground connections 21-24, a signal pattern: L-H-H-L.

If the ground line of the cable harness is connected to the external ground connection 17, a current can flow via the primary ground 21 and the coding grounds 22, 23 and 24 when a supply voltage is applied to the internal ground connections 21-24. This produces, at the internal ground connections 21-24, a signal pattern: L-L-L-L.

If the ground line of the cable harness is connected to the external ground connection 18, a current can flow via the primary ground 21 and via the coding grounds 22, 24 when a supply voltage is applied to the internal ground connections 21-24. This produces, at the internal ground connections 21-24, a signal pattern: L-L-H-L.

Figure 2:
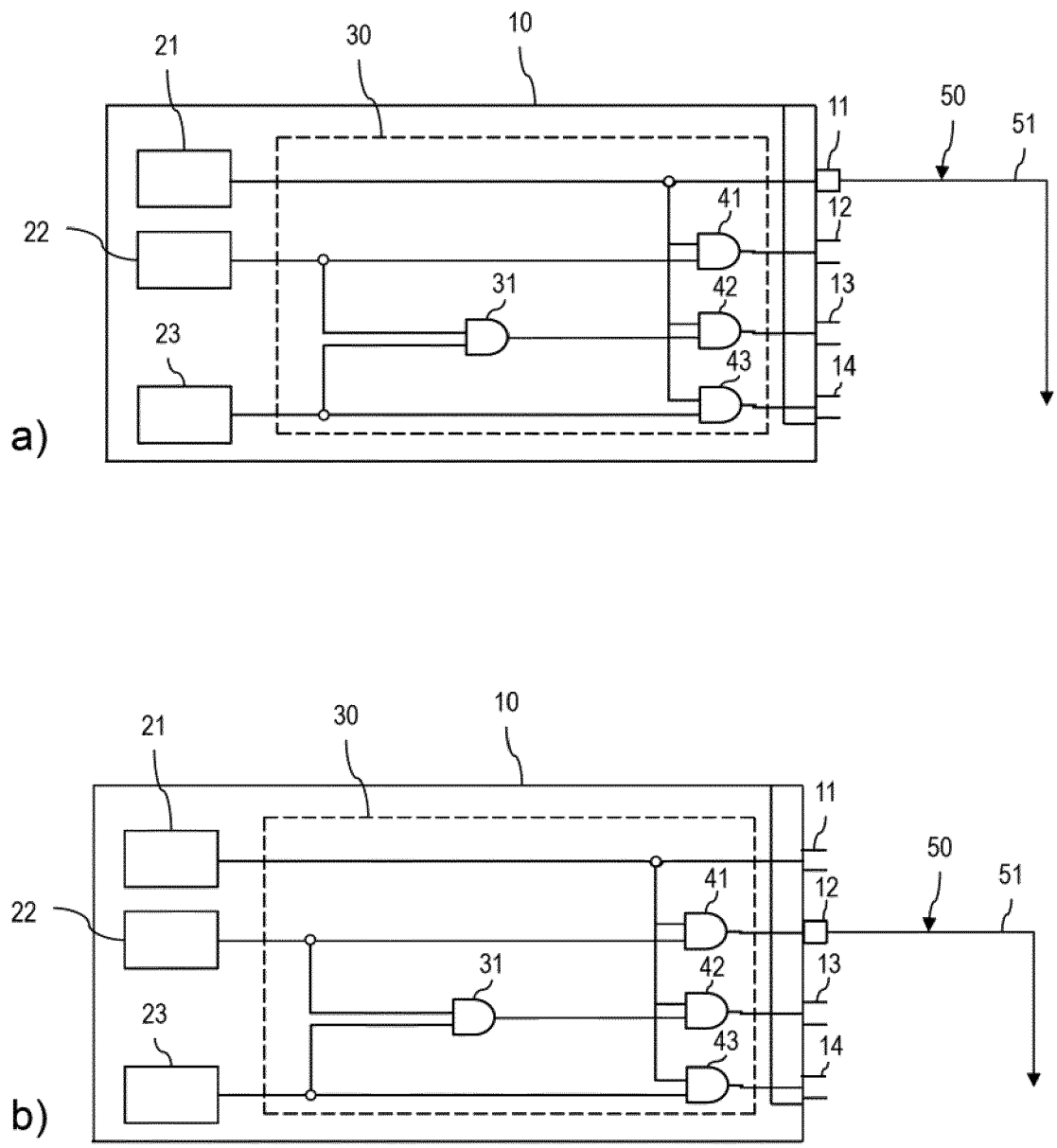
FIGS. 2a, 2b, 2c, and 2d each show an electronic component according to the invention with which position detection via ground coding using a single ground line is made possible.
Figure 2:
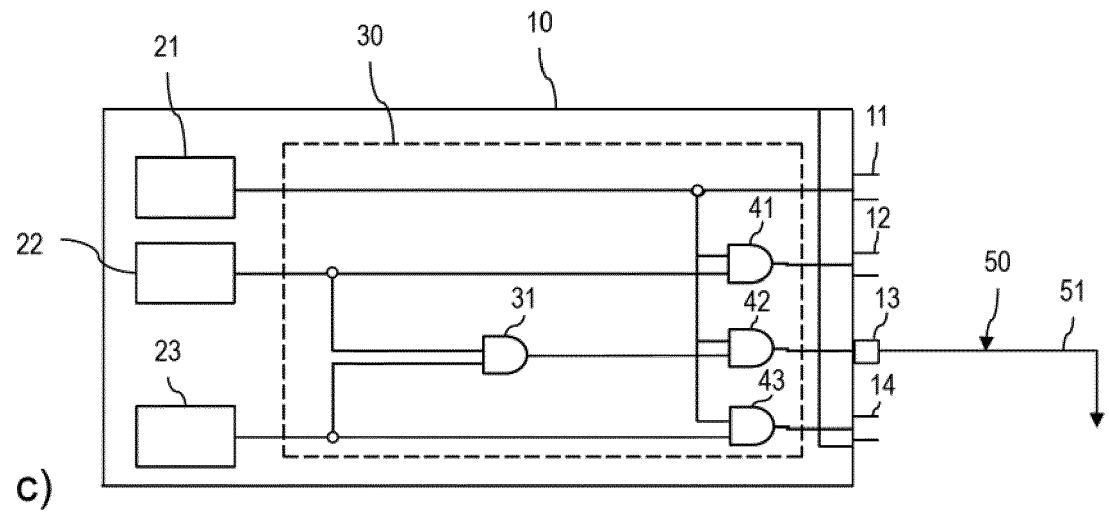
Figure 2:
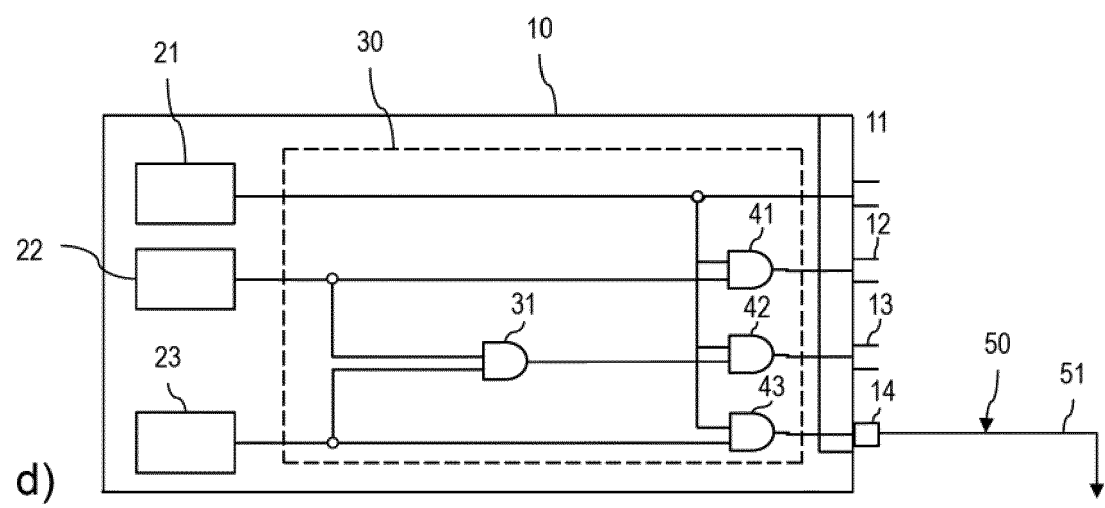

The components illustrated in the exemplary embodiments of FIGS. 2 to 4 in each case, i.e. the internal ground connections 21-24 and the combination circuit 30, can be realized as an IC chip and as a simple circuit on a carrier, e.g. on a circuit board.

The proposed electronic component having a combination circuit eliminates welded connectors with longitudinal water sealing in a cable harness of the motor vehicle for the purpose of position detection via ground coding. The combination circuit defines, via an output in each case, the position of the component in the motor vehicle at the physical interface (external ground connection) to the cable harness. The number of external ground connections or outputs is dependent here on the possible positionings of the identically constructed component in the motor vehicle. A large number of positions can therefore theoretically be defined without limitation.

It is also possible that the evaluation circuit can detect the position of the relevant electronic component in the motor vehicle via the inputs of the combination circuit.

LIST OF REFERENCE SIGNS

10 electronic component (sensor, actuator, control device)
11-17 external ground connections
21 internal ground connection (primary ground)
22-24 internal ground connections (coding ground)
30 combination circuit
31-33 logic chip
34 logic chip
41-47 logic chip
50 cable harness
51-53 ground line
54 ultrasonic welded connector
55 collector line
131-139 diodes
141-147 diodes

The invention claimed is:

1. An electronic component with ground coding for a motor vehicle, comprising:
a plurality of external ground connections for selectively connecting to a cable harness of the motor vehicle;
a plurality of internal ground connections, wherein each internal ground connection is electrically coupled to an assigned external ground connection so that the potential present at a respective internal ground connection corresponds to the potential present at the assigned external ground connection;
an evaluation circuit coupled to the plurality of internal ground connections and configured to determine at which first subset of the internal ground connections first signal information representing a reference potential as a first potential is present and at which second subset of the internal ground connections second signal information representing a supply voltage potential as a second potential is present in order to infer a coding of the component from the pattern of the internal ground connections supplied with the first and the second potential; and
a combination circuit configured to connect the plurality of internal ground connections to the plurality of external ground connections in such a way that, when a ground line of a cable harness is connected to precisely one of the external ground connections, the first signal information is present at a respectively different first subset of the internal ground connections in a predetermined manner depending on which of the external ground connections the ground line is connected to.

2. The electronic component according to claim 1, wherein the plurality of external ground connections and the plurality of internal ground connections each comprise at least two ground connections.

3. The electronic component according to claim 1, wherein a first ground connection of the plurality of internal ground connections is connected to a primary ground of the motor vehicle, and all the other ground connections of the plurality of internal ground connections are connected to a respective coding ground, wherein a respective coding ground is a ground derived from the primary ground.

4. The electronic component according to claim 1, wherein a number of the plurality of external ground connections is defined by a required number of codings, wherein the number n of the codings is determined from the number CM of the coding grounds as: $n=2^{CM}$.

5. The electronic component according to claim 1, wherein the combination circuit comprises a plurality of logic chips which connect the plurality of internal ground connections to the plurality of external ground connections.

6. The electronic component according to claim 5, wherein the plurality of logic chips are interconnected in one or at least two cascade stages.

7. The electronic component according to claim 6, wherein various ones of the plurality of logic chips of a cascade stage that are respectively connected to the plurality of external ground connections on an output side are respectively connected directly to a first ground connection of the plurality of internal ground connections on an input side of the plurality of logic chips, wherein the first ground connection is connected to a primary ground of the motor vehicle.

8. The electronic component according to claim 5, wherein the plurality of logic chips are of one or more of the following types: AND gates, NOT gates, NAND gates, NOR gates, XOR gates, XNOR gates, transistors, or diodes.

9. The electronic component according to claim 1, wherein the electronic component is an integrated circuit (IC) chip.

10. The electronic component according to claim 1, wherein the electronic component is a discrete circuit on a carrier.

11. The electronic component according to claim 1, wherein the electronic component is designed as a:

radar sensor;
seat module;
seat heating control device;
seat pneumatic module;
back seat monitor;
wireless charging tray.

12. A motor vehicle having a plurality of electronic components according to claim 1.

\* \* \* \* \*